US008823064B2

(12) United States Patent
Chang et al.

(10) Patent No.: US 8,823,064 B2
(45) Date of Patent: Sep. 2, 2014

(54) ASYMMETRIC FET FORMED THROUGH USE OF VARIABLE PITCH GATE FOR USE AS LOGIC DEVICE AND TEST STRUCTURE

(75) Inventors: Josephine B. Chang, Mahopac, NY (US); Chung-Hsun Lin, White Plains, NY (US); Isaac Lauer, Mahopac, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/441,048

(22) Filed: Apr. 6, 2012

(65) Prior Publication Data

US 2013/0256797 A1    Oct. 3, 2013

Related U.S. Application Data

(63) Continuation of application No. 13/434,128, filed on Mar. 29, 2012.

(51) Int. Cl.
*H01L 27/12* (2006.01)

(52) U.S. Cl.
USPC ........... 257/288; 257/206; 257/506; 438/151; 438/587; 438/786

(58) Field of Classification Search
USPC ........... 257/347, 206, 506; 438/587, 151, 786
See application file for complete search history.

(56) References Cited

U.S. PATENT DOCUMENTS

| 6,083,794 | A | 7/2000 | Hook et al. | |
| 6,297,104 | B1 | 10/2001 | Tyagi et al. | |
| 6,458,666 | B2 | 10/2002 | Wasshuber | |
| 6,489,223 | B1 * | 12/2002 | Hook et al. | 438/524 |
| 6,617,085 | B1 * | 9/2003 | Kanh et al. | 430/5 |
| 6,806,155 | B1 * | 10/2004 | Ko et al. | 438/303 |
| 6,916,716 | B1 | 7/2005 | Goad et al. | |
| 6,946,353 | B2 | 9/2005 | Tran | |
| 7,144,782 | B1 | 12/2006 | Ehrichs | |
| 7,378,306 | B2 * | 5/2008 | Spencer et al. | 438/199 |
| 7,521,380 | B2 * | 4/2009 | Waite et al. | 438/786 |

(Continued)

OTHER PUBLICATIONS

Nayfeh et al., "Impact of Lateral Asymmetric Channel Doping on 45-nm-Technology N-Type SOI MOSFETs," IEEE Transactions on Electronic Devices, vol. 56, No. 12, pp. 3097-3105 (Dec. 2009).

*Primary Examiner* — Kevin Parendo
*Assistant Examiner* — Charles N Ausar-El
(74) *Attorney, Agent, or Firm* — Vazken Alexanian; Michael J. Chang, LLC

(57) ABSTRACT

Asymmetric FET devices and methods for fabrication thereof that employ a variable pitch gate are provided. In one aspect, a FET device is provided. The FET device includes a wafer; a plurality of active areas formed in the wafer; a plurality of gate stacks on the wafer, wherein at least one of the gate stacks is present over each of the active areas, and wherein the gate stacks have an irregular gate-to-gate spacing such that for at least a given one of the active areas a gate-to-gate spacing on a source side of the given active area is greater than a gate-to-gate spacing on a drain side of the given active area; spacers on opposite sides of the gate stacks; and an angled implant in the source side of the given active area.

20 Claims, 7 Drawing Sheets

(56) References Cited

U.S. PATENT DOCUMENTS

| | | |
|---|---|---|
| 7,550,355 B2 | 6/2009 | Kohyama |
| 7,727,838 B2 | 6/2010 | Obradovic et al. |
| 8,299,508 B2* | 10/2012 | Hsieh et al. .................. 257/288 |
| 2005/0127399 A1* | 6/2005 | Meadows ...................... 257/194 |
| 2007/0278557 A1* | 12/2007 | Chen et al. .................... 257/315 |
| 2011/0163379 A1* | 7/2011 | Sleight et al. ................. 257/347 |
| 2011/0163380 A1* | 7/2011 | Sleight et al. ................. 257/347 |
| 2012/0074499 A1* | 3/2012 | Haffner et al. ................ 257/368 |

* cited by examiner

LENGTH OF ONE OR MORE GATE STACKS CAN BE REDUCED TO FURTHER INCREASE GATE-TO-GATE SPACING

LENGTH OF ONE OR MORE GATE STACKS CAN BE REDUCED TO FURTHER INCREASE GATE-TO-GATE SPACING

US 8,823,064 B2

ASYMMETRIC FET FORMED THROUGH USE OF VARIABLE PITCH GATE FOR USE AS LOGIC DEVICE AND TEST STRUCTURE

CROSS-REFERENCE TO RELATED APPLICATION(S)

This application is a continuation of U.S. application Ser. No. 13/434,128 filed on Mar. 29, 2012, the disclosure of which is incorporated by reference herein.

FIELD OF THE INVENTION

The present invention relates to integrated circuits, and more particularly, to asymmetric field-effect transistor (FET) devices and methods for fabrication thereof that employ a variable pitch gate.

BACKGROUND OF THE INVENTION

With the continued scaling of metal-oxide semiconductor (MOS) circuits, technical challenges arise. For example, there is a point beyond which the gate oxide thickness cannot be reduced due to the increase in leakage current that is experienced. As a result, this limitation on gate oxide thickness can lead to short channel effects which degrade performance of the device. Non-uniform doping profiles using angled halo or extension implants have been employed to reduce these short channel effects.

However, as device pitch is further scaled, problems arise regarding angled halo/extension implants and the effect adjacent devices have in shielding and thus preventing proper use of this technique. For example, angled halo or extension implants are generally performed at a 20 degree to 30 degree tilt angle. However with small gate-to-gate spacing (tight pitch) the gates from adjacent devices prevent the angled implant from being performed (i.e., due to shielding).

Therefore, techniques for fabricating asymmetric field-effect transistor (FET) devices at a dense pitch would be desirable.

SUMMARY OF THE INVENTION

The present invention provides asymmetric field-effect transistor (FET) devices and methods for fabrication thereof that employ a variable pitch gate. In one aspect of the invention, a method for fabricating a FET device is provided. The method includes the following steps. A wafer is provided. The wafer can be a bulk semiconductor wafer or a semiconductor-on-insulator (SOI) wafer. A plurality of active areas is formed in the wafer using shallow trench isolation (STI). A plurality of gate stacks is formed on the wafer, wherein at least one of the gate stacks is present over each of the active areas, and wherein the gate stacks have an irregular gate-to-gate spacing such that for at least a given one of the active areas a gate-to-gate spacing on a source side of the given active area is greater than a gate-to-gate spacing on a drain side of the given active area. Spacers are formed on opposite sides of the gate stacks. An angled implant is performed into the source side of the given active area. The gate stacks can be formed each having a gate length L, wherein the gate length L is configured to produce the gate-to-gate spacing on the source side of the given active area.

In another aspect of the invention, a FET device is provided. The FET device includes a wafer; a plurality of active areas formed in the wafer; a plurality of gate stacks on the wafer, wherein at least one of the gate stacks is present over each of the active areas, and wherein the gate stacks have an irregular gate-to-gate spacing such that for at least a given one of the active areas a gate-to-gate spacing on a source side of the given active area is greater than a gate-to-gate spacing on a drain side of the given active area; spacers on opposite sides of the gate stacks; and an angled implant in the source side of the given active area.

A more complete understanding of the present invention, as well as further features and advantages of the present invention, will be obtained by reference to the following detailed description and drawings.

DETAILED DESCRIPTION OF PREFERRED EMBODIMENTS

As provided above, as device pitch increases, the ability to perform angled halo and/or extension implants is hampered by the shielding effect the tight gate-to-gate spacing has on adjacent (neighboring) devices. Advantageously, techniques are provided herein to overcome this problem and permit the formation of asymmetric field-effect transistor (FET) devices with a highly scaled pitch. In general, the present techniques are directed to increasing the gate-to-gate spacing which thereby avoids the shielding problem. Several techniques will be described herein to attain increased gate-to-gate spacing. The first two approaches involve employing an irregular gate pitch by irregular gate stack patterning to selectively produce a relatively larger gate pitch or by eliminating a gate stack where needed, e.g., adjacent to an asymmetrical device, thereby avoiding the shielding effect the smaller gate pitch/eliminated gate stack would otherwise have on the adjacent device. Gate pitch is defined herein as a distance from the middle of one gate stack to the middle of the next adjacent gate stack. In the following description, the terms "gate" and "gate stack" are used interchangeably.

The third approach involves varying the gate length (see FIG. 9, described below), to achieve a desired (e.g., greater) gate-to-gate spacing. By using these techniques to selectively increase the gate-to-gate spacing where needed, angled halo and/or extension implants can be easily performed without the complication of shielding by adjacent device gates.

The first approach will now be described. As highlighted above, this approach involves forming gate stacks having an irregular pitch produced during the gate patterning step so as to increase gate-to-gate spacing. In general, each FET includes a source and a drain interconnected by a channel. A gate (which is typically separated from the channel by a dielectric material(s), i.e., a gate dielectric) regulates current flow through the channel.

The process begins with a wafer such as a bulk semiconductor (silicon (Si), germanium (Ge), silicon-germanium (SiGe)) wafer or a semiconductor (Si, Ge or SiGe)—on-insulator (SOI) wafer. A SOI wafer generally includes a SOI layer (formed from the semiconductor material) that is separated from a substrate (e.g., a semiconductor Si, Ge or SiGe substrate) by a buried oxide (or BOX).

Figure 1A:
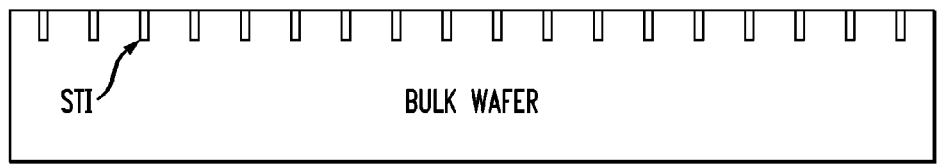
FIG. 1A is a cross-sectional diagram illustrating a starting structure for a field-effect transistor (FET) device fabrication process, i.e., a bulk semiconductor wafer, in which a plurality of active areas has been formed according to an embodiment of the present invention.
Figure 1B:
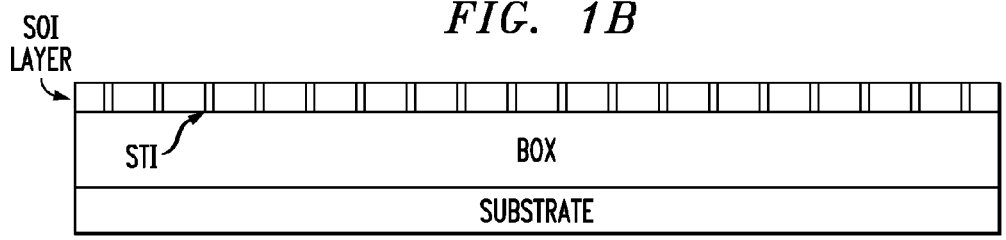
FIG. 1B is a cross-sectional diagram illustrating an alternative starting structure for a FET device fabrication process, i.e., a silicon-on-insulator (SOI) wafer having an active layer separated from a substrate by a buried oxide (BOX), in which a plurality of active areas has been formed according to an embodiment of the present invention.

As shown in FIGS. 1A and 1B, a plurality of active areas is formed in the wafer. FIG. 1A illustrates the instance where a bulk semiconductor wafer is employed and FIG. 1B illustrates the instance where an SOI wafer is employed. In both the bulk wafer and the SOI wafer embodiments, shallow trench isolation (STI) is used to form the active areas in the wafer. STI involves patterning trenches in the wafer and then filling the trenches with an insulator material, such as an oxide. See FIGS. 1A and 1B. In the case of the SOI wafer, as shown in FIG. 1B, the STI trenches extend through the SOI layer down to the BOX in order to achieve complete isolation of the active areas.

Figure 2A:
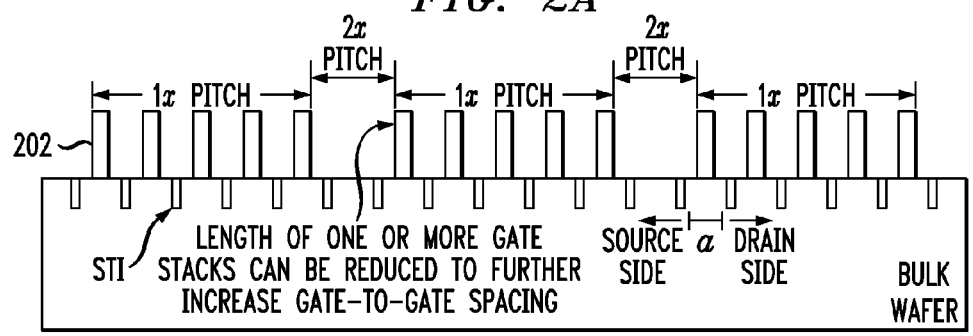
FIG. 2A is a cross-sectional diagram illustrating a plurality of gate stacks having been formed on the wafer with an irregular pitch in the bulk wafer configuration according to an embodiment of the present invention.
Figure 2B:
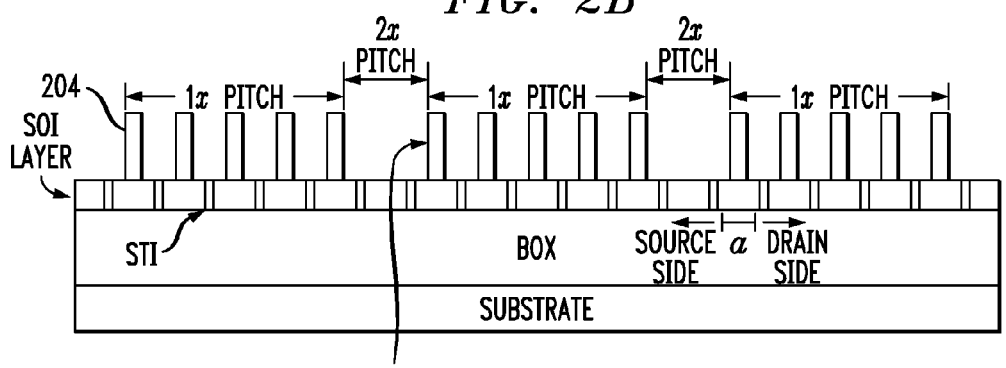
FIG. 2B is a cross-sectional diagram illustrating a plurality of gate stacks having been formed on the wafer with an irregular pitch in the SOI wafer configuration according to an embodiment of the present invention.

Next, a plurality of gate stacks 202/204 is formed on the wafer. See FIGS. 2A and 2B, respectively. FIG. 2A (which follows from FIG. 1A) depicts the bulk wafer embodiment, whereas FIG. 2B (which follows from FIG. 1B) depicts the SOI wafer embodiment. As shown in FIGS. 2A and 2B, the gate stacks 202/204 are formed having an irregular pitch. Specifically, a first gate pitch is employed for some regions while a second, larger gate pitch is employed for other regions. Thus, the gate stacks formed in one or more regions of the wafer have a first gate pitch and the gate stacks formed in one or more other regions have a second gate pitch, where the second gate pitch is larger than the first gate pitch. Using a non-limiting example to illustrate this concept, for a given gate pitch x, a first gate pitch of 1x may be employed for some regions of the wafer, while a second (larger) gate pitch of 1.5x, 2x, 3x, etc. is employed for other regions. Thus for instance, if a gate pitch x of 200 nanometers (nm) is being employed, the first gate pitch will be 200 nm and the second gate pitch will be 400 nm. The above-provided gate pitch values (e.g., 1.5x, 2x, 3x, etc.) are merely exemplary and, according to the present techniques, any gate pitch values may be employed as long as there is at least one region of the wafer having gate stacks with a first pitch and at least one other region of the wafer having gate stacks with a second pitch such that the second pitch is greater than the first pitch. In practice, the irregular gate pattern could be achieved (using for example, optical lithography, e-beam lithography, etc. as described above) with any two gate pitches desired. As will be apparent from the description below, the pitch employed in the second (larger) gate pitch regions will depend on the angle of the tilted implant that is being employed in the asymmetric devices.

As is apparent from FIGS. 2A and 2B, selectively employing a larger gate pitch in one or more regions of the wafer increases the gate-to-gate spacing in these regions vis-à-vis the regions of the wafer having a smaller gate pitch. See also FIG. 9, described below. FIGS. 2A and 2B portray the non-limiting example described above wherein the gate stacks formed in one or more regions of the wafer have a (first) 1x gate pitch and the gate stacks formed in one or more other regions have a (second) 2x gate pitch. This is merely an example being provided to illustrate the present techniques. As highlighted above, any irregular gate pitch values may be employed (e.g., 1.5x, 2x, 3x, etc.) as long as there is at least one region of the wafer having gate stacks with a first pitch and at least one other region of the wafer having gate stacks with a second pitch such that the second pitch is greater than the first pitch.

Accordingly, the gate stacks in this embodiment are produced having an irregular gate-to-gate-spacing, with the gate-to-gate spacing in the (in this example the 1x gate pitch regions) being smaller than the gate-to-gate spacing in the (in this example the 2x gate pitch regions). As will be described in detail below, the present techniques are used to increase/employ a larger gate-to-gate spacing on a source side of one or more of the active areas. This will permit the space necessary (free from adjacent gate shielding) to perform an angled halo or extension implant into the active area(s).

Figure 9:
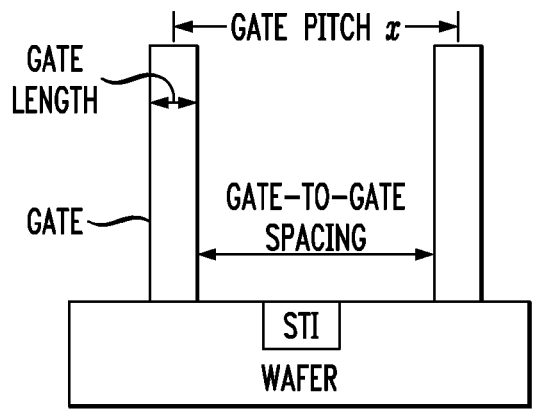
FIG. 9 is a cross-sectional diagram illustrating gate pitch, gate-to-gate spacing and gate length measurements according to an embodiment of the present invention.

By way of example only, as shown in FIGS. 2A and 2B, for a given active area a, the pitch on a source side (in this case to the left) of the active area a is larger (in this example 2x), whereas the pitch on a drain side (in this case to the right) of the active area a is smaller (in this example 1x), wherein for example 2x>1x. Reference to FIG. 9 described below, for example, reveals that this configuration corresponds to a greater gate-to-gate spacing on the source side of the active area a as compared to the gate-to-gate spacing on the drain side of the active area a. Accordingly, the increased gate-to-gate spacing on the source side of the active area will permit the space needed to perform angled implants into the source side of the active area a (see below).

Gate stacks in a conventional device fabrication scheme are typically patterned using an optical lithography process (such as photolithography). As is known in the art, gate stack optical lithography generally involves depositing the gate stack material(s), depositing a resist on the gate stack material(s), exposing the resist (e.g., using x-ray, ion beam, extreme ultra-violet (EUV)) through a lithography mask to form a positive or negative resist with the footprint and location of the gate stacks, etching the gate stack material(s) through the resist to form the gate stacks and then stripping the resist. However, while optical lithography is well-suited (i.e., high production yield) for regular, repeating patterns, optical lithography is (in practice) difficult to implement in situations such as the present example where complex, irregular gate patterns are desired due to the level of process variation that would likely result. However, an irregular pattern optical lithography mask could be created if so desired, and is within the capabilities of one skilled in the art. Such an irregular optical lithography mask could then be implemented, according to the present techniques, along with an optical lithography process to create the instant irregular gate patterns.

One exemplary alternative process to conventional optical lithography for creating the irregular gate pattern in this example is electron beam (e-beam) lithography. Like with optical lithography, e-beam lithography involves patterning a resist, positive or negative, on the gate stack material(s) with the footprint and location of the gate stacks, patterning the gate stack material(s) and then stripping the resist. By way of example only, the gate stack materials might include a dielectric material such as silicon dioxide or a high-k dielectric such as hafnium oxide, followed by a metal(s) or polysilicon. Suitable e-beam resist materials include, but are not limited to, poly methyl methacrylate (PMMMA). By comparison with optical lithography, e-beam lithography is well suited for forming complex patterns. Rather than patterning the resist using a mask (as with optical lithography), e-beam lithography (a maskless process) involves emitting a beam of electrons in a patterned fashion to pattern the resist. By way of example only, direct write e-beam systems employ an e-beam spot that is moved with respect to the substrate being patterned to expose the substrate one pixel at a time. Accordingly, very complex and intricate patterns can be created using e-beam lithography. Thus, according to the present techniques, any patterning process capable of producing irregular patterned gate stacks may be employed. To improve production yield, it may be desirable to employ a high-speed process for creating complex patterns, such as e-beam lithography. However, optical lithography may be adapted and employed to create the irregular gate patterns if so desired.

Further, the dimensions of the gate stacks may be chosen and/or selectively tailored so as to increase the gate-to-gate spacing. Gate length, for example, can be selectively decreased for one or more gates, thereby increasing the gate-to-gate spacing (for a given gate pitch) for these reduced-length gates. See FIGS. 9 and 10, described below. Thus, by way of example only, the gate-to-gate spacing achieved by patterning gates with an irregular gate pitch can be further tailored (e.g., increased further) by selectively scaling the length of one or more of the gates (as illustrated, for example, in FIG. 10) so as to achieve an even larger gate-to-gate spacing. According to an exemplary embodiment, the gates are each patterned having a common gate length L and an additional step is employed to selectively reduce the gate length of one or more of the gates. Following this gate length reducing step, one or more of the gate stacks will have a smaller gate length, i.e., $L_{reduced}$, as compared to the gate length L of the other (unaltered) gate stacks. By way of example only, in the context of the exemplary procedure shown illustrated in FIGS. 2A and 2B, the length of one or more of the gate stacks can be reduced to further increase gate-to-gate spacing. For instance, reducing the length of the gate stack (as indicated in FIGS. 2A and 2B) will further increase the gate-to-gate spacing beyond that achieved by patterning the gate stacks with a (e.g., 2x) pitch. This gate length scaling process can be performed on any of the gate stacks and is thus not limited to those indicated in FIGS. 2A and 2B. This gate length scaling process may or may not result in a change in gate pitch. Namely, as described above, gate pitch is defined herein as a distance from the middle of one gate stack to the middle of the next adjacent gate stack. Thus, if the gate length scaling process is performed uniformly to thin both sides of the gate stack (see FIGS. 9 and 10, described below), then the gate pitch may not change, but the gate-to-gate spacing will increase. According to an exemplary embodiment, the gate length of one or more of the gate stacks is reduced by patterning a hardmask (e.g., a nitride hardmask) that i) completely covers those gate stacks which will not be altered and ii) covers a central portion of the gate stack(s) the length of which will be reduced. See, for example, FIG. 10, described below. Of course, the amount of the hardmask covering the gate stack(s) to be altered (and how much of those gate stacks remain exposed) is dependent on how much thinning of the gate stack(s) is desired. The formation of a hardmask meeting these requirements is well within the capabilities of one skilled in the art. An etch (for example a reactive ion etching (RIE) process) through the hardmask can then be used to remove gate stack material from the selectively masked gate stack(s) (again see, for example, FIG. 10, described below) to thin and thereby reduce the length of those etched gate stacks. Any hardmask remaining after the etch can be removed using an etching process such as chemical mechanical polishing (CMP).

Figure 3A:
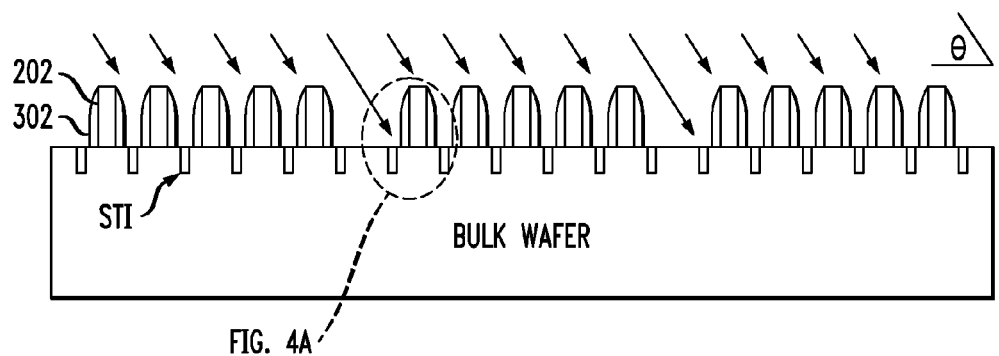
FIG. 3A is a cross-sectional diagram illustrating spacers having been formed on opposite sides of the gate stacks and an angled halo/extension implant being performed in the bulk wafer configuration according to an embodiment of the present invention.

Following formation of the gate stacks 202/204, spacers 302/304 may be formed on opposite sides of the gate stacks 202/204. See FIGS. 3A and 3B, respectively. FIG. 3A (which follows from FIG. 2A) depicts the bulk wafer embodiment, whereas FIG. 3B (which follows from FIG. 2B) depicts the SOI wafer embodiment. According to an exemplary embodiment, spacers 302/304 are formed by first blanket depositing a nitride material (e.g., silicon nitride) onto the wafer (e.g., using chemical vapor deposition (CVD)) and then patterning the spacers 302/304 using a nitride-selective reactive ion etching (RIE).

Figure 3B:
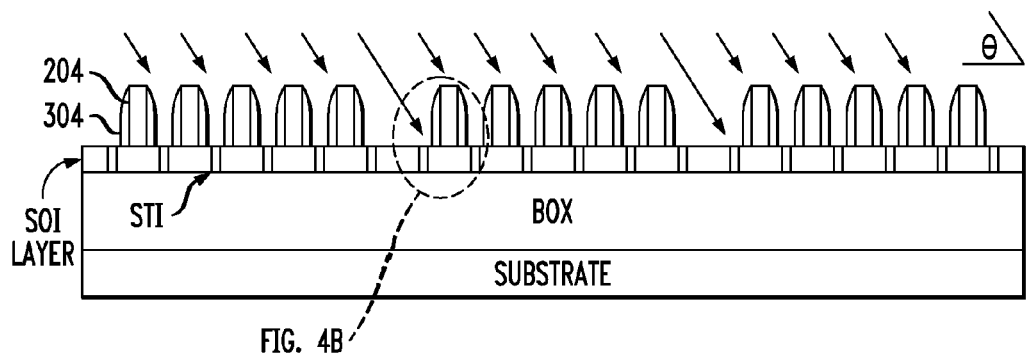
FIG. 3B is a cross-sectional diagram illustrating spacers having been formed on opposite sides of the gate stacks and an angled halo/extension implant being performed in the SOI wafer configuration according to an embodiment of the present invention.
Figure 4A:
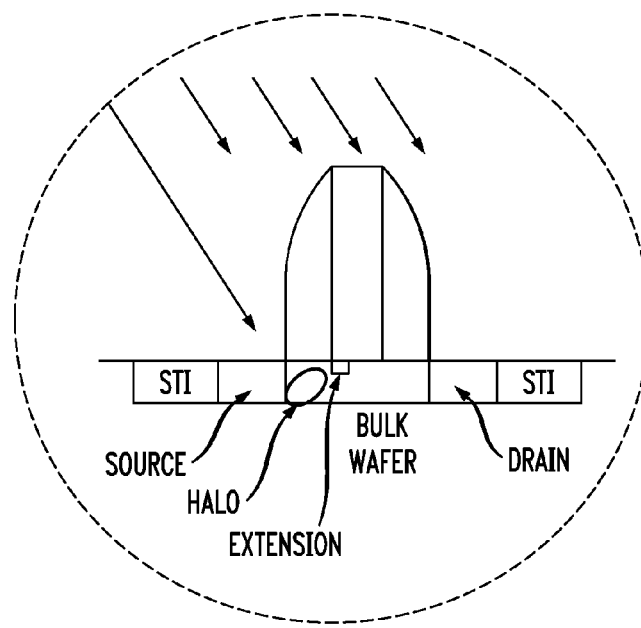
FIG. 4A is a cross-sectional diagram illustrating a magnified view of FIG. 3A which further details the angled halo/extension implant process in the bulk wafer configuration according to an embodiment of the present invention.
Figure 4B:
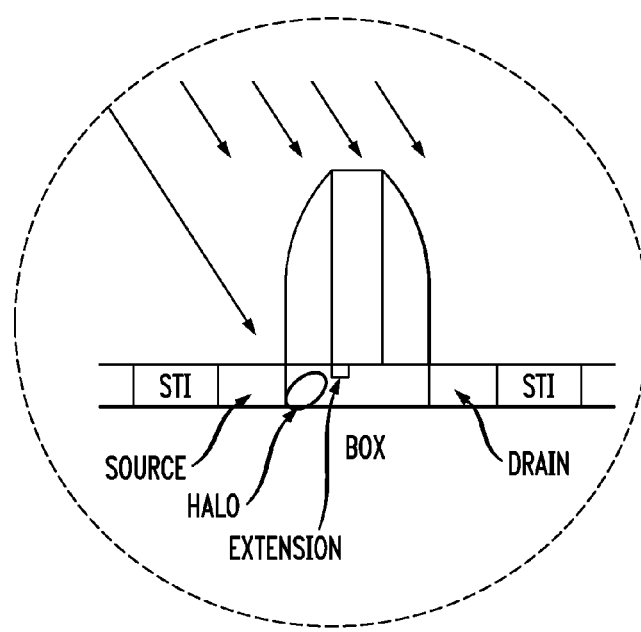
FIG. 4B is a cross-sectional diagram illustrating a magnified view of FIG. 3A which further details the angled halo/extension implant process in the SOI wafer configuration according to an embodiment of the present invention.

As shown in FIGS. 3A and 3B, an angled halo or extension implant is then performed. Angled implants are performed to ensure that implanted dopants penetrate under the edge of the gate stack (see, for example, FIGS. 4A and 4B). As will be described in detail below, in the case of halo implants, the present techniques may be used to determine an optimum angle (or strength) of the angled halo implant as per device performance. According to an exemplary embodiment, the implant is preferably performed at an angle θ of from about 20 degrees to about 30 degrees into the source side of the active areas having an increased/that employ a larger gate-to-gate spacing. Implants at more or less aggressive angles may also be employed in the same manner. As highlighted above, the pitch employed in the second (larger) gate pitch regions of the wafer will depend on the angle of the tilted implant that is being employed in the asymmetric devices. Thus, a smaller, less aggressive angle of implant will require a greater pitch (e.g., a 20 degree implant will require more space and thus a greater pitch than would a 30 degree implant). Suitable implant dopants include, but are not limited to, p-type dopants (for an n-channel field effect transistor (FET) device) such as boron (B), indium (In), boron fluoride ($BF_2$), etc., or n-type dopants for a p-channel (FET) device) such as phosphorous (P), arsenic (As), antimony (Sb), etc. FIGS. 4A and 4B show an enlarged section of FIGS. 3A and 3B, respectively, to better detail the halo/extension implant process. The devices receiving an angled halo or extension implant are referred to herein as asymmetrical devices, while those devices not receiving an angled halo or extension implant are referred to herein as symmetrical devices.

For those devices not receiving an angled halo or extension implant (i.e., the symmetrical devices), a step may be employed (not shown) to perform a conventional vertical implant. According to an exemplary embodiment, this vertical implant step is performed either immediately before, or immediately after the angled halo or extension implant is performed. As above, suitable implant dopants include, but are not limited to, p-type dopants (for an n-channel FET device) such as B, In, $BF_2$, etc., or n-type dopants for a p-channel FET device) such as P, As, Sb, etc. Any further standard processing steps may also be performed, if so desired, to complete the device. By way of example only, raised source and drain regions may be formed using conventional epitaxy processes, and may be doped accordingly.

As highlighted above, the present techniques are directed to increasing the gate-to-gate spacing during FET device fabrication, so as to permit angled halo/extension implants to be performed even at scaled gate pitches. It is notable that the various techniques provided herein may be implemented independently, or alternatively, may be combined if so desired. By way of example only, the above-described technique involves intentionally patterning an irregular gate pattern. Now an example will be described wherein an irregular gate pattern is achieved by first patterning a regular/repeating gate pattern, and then selectively removing at least one gate stack to achieve an irregular gate pattern. If so desired, the above-described irregular gate patterning technique could be employed, followed by a process to selectively remove a gate stack as is now described.

Figure 5A:
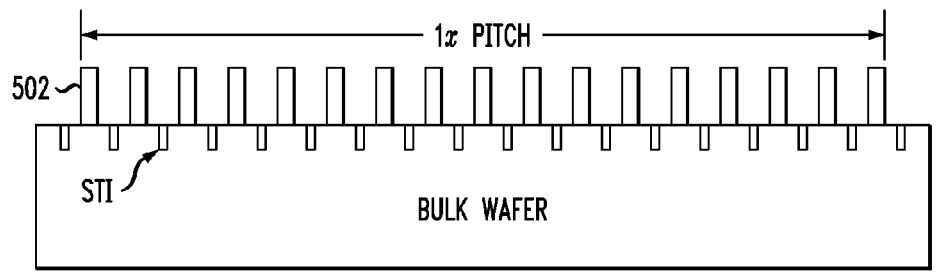
FIG. 5A is a cross-sectional diagram illustrating an alternative embodiment wherein a plurality of gate stacks has been formed on the bulk wafer (of FIG. 1A) with a regular pitch according to an embodiment of the present invention.
Figure 5B:
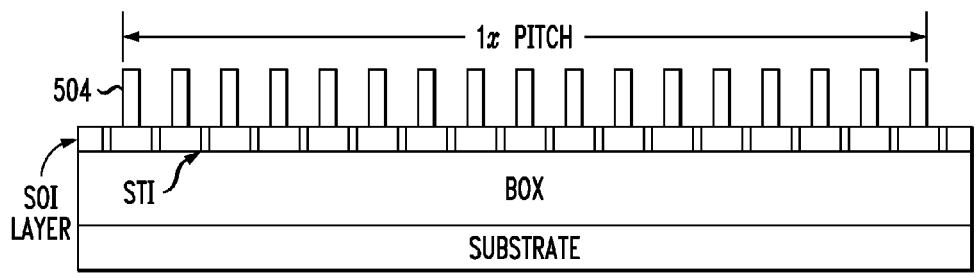
FIG. 5B is a cross-sectional diagram illustrating an alternative embodiment wherein a plurality of gate stacks has been formed on the SOI wafer (of FIG. 1B) with a regular pitch according to an embodiment of the present invention.

The starting structures, i.e., a bulk semiconductor wafer or a SOI wafer, are the same as that shown in FIGS. 1A and 1B. Thus in this example, as was described above, the fabrication process begins by forming a plurality of active areas in the given wafer using STI. Next, a plurality of gate stacks 502/504 is formed on the wafer. See FIGS. 5A and 5B, respectively. FIG. 5A (which follows from FIG. 1A) depicts the bulk wafer embodiment, whereas FIG. 5B (which follows from FIG. 1B) depicts the SOI wafer embodiment. By comparison with the above-described embodiment, in this example, as shown in FIGS. 5A and 5B, the gate stacks 502/504 are formed having a regular pitch. By way of example only, for a given gate pitch x (e.g., 200 nm), the gate stacks are produced at a pitch 1x. Further, in this case, since a regular gate pitch is being patterned (see above), optical lithography can be used to pattern the gates stacks 502/504. With regular/repeated pitch, optical lithography produces a high yield with minimal process variation.

As described above, optical lithography to pattern the gate stacks (e.g., gates stacks 502/504) can involve depositing the gate stack material(s), depositing a resist on the gate stack material(s), exposing the resist (e.g., using x-ray, ion beam, EUV) through a lithography mask to form a positive or negative resist with the footprint and location of the gate stacks, etching the gate stack material(s) through the resist to form the gate stacks and then stripping the resist. By way of example only, the gate stack materials can be blanket deposited (for example using spin coating) onto the wafer as a series of layers in a stack. The gate stack materials might include a dielectric material such as silicon dioxide or a high-k dielectric such as hafnium oxide, followed by a metal(s) or polysilicon.

As will be described in detail below, the dimensions of the gate stacks may be chosen so as to increase the gate-to-gate spacing. Gate length, for example, can be decreased, thereby increasing the gate-to-gate spacing for a given gate pitch. See description below.

Figure 6A:
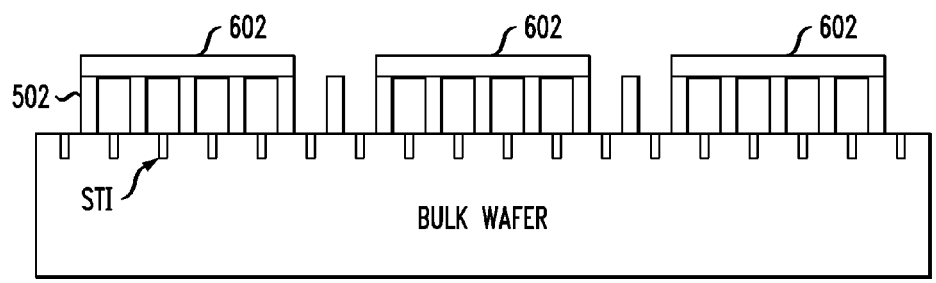
FIG. 6A is a cross-sectional diagram illustrating a mask having been formed over the gate stacks masking those gate stacks that are to remain and leaving exposed those gate stacks that are to be removed in the bulk wafer configuration according to an embodiment of the present invention.
Figure 6B:
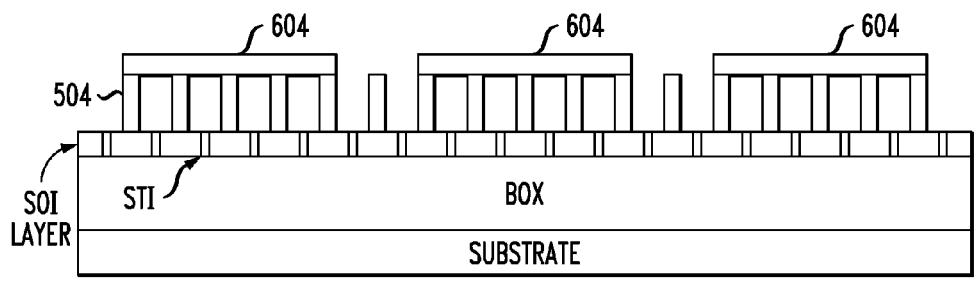
FIG. 6B is a cross-sectional diagram illustrating a mask having been formed over the gate stacks masking those gate stacks that are to remain and leaving exposed those gate stacks that are to be removed in the SOI wafer configuration according to an embodiment of the present invention.

Following formation of gate stacks 502/504, a (e.g., nitride) mask 602/604 is formed over the gate stacks masking those gate stacks that are to remain and leaving exposed those gate stacks that are to be removed (see below). See FIGS. 6A and 6B, respectively. FIG. 6A (which follows from FIG. 5A) depicts the bulk wafer embodiment, whereas FIG. 6B (which follows from FIG. 5B) depicts the SOI wafer embodiment.

Figure 7A:
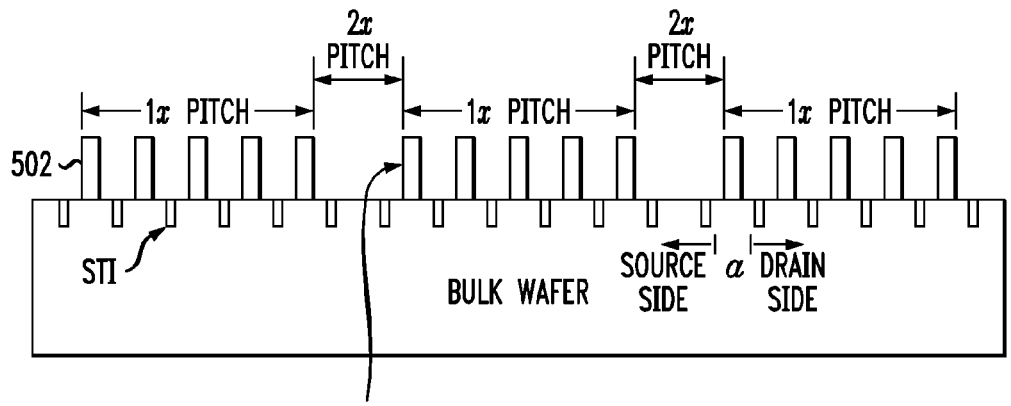
FIG. 7A is a cross-sectional diagram illustrating an etch through the mask having been performed to remove the exposed gate stacks in the bulk wafer configuration according to an embodiment of the present invention.
Figure 7B:
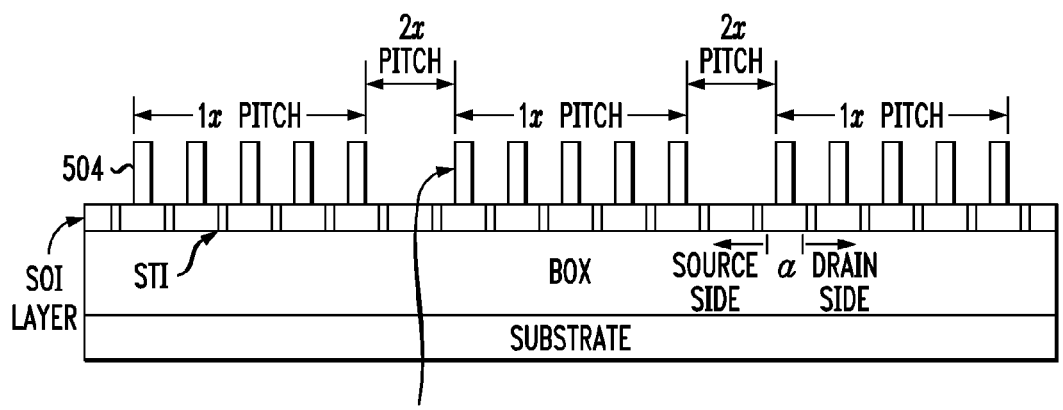
FIG. 7B is a cross-sectional diagram illustrating an etch through the mask having been performed to remove the exposed gate stacks in the SOI wafer configuration according to an embodiment of the present invention.

An etch through the mask 602/604 is then used to remove the exposed gate stacks. See FIGS. 7A and 7B, respectively. FIG. 7A (which follows from FIG. 6A) depicts the bulk wafer embodiment, whereas FIG. 7B (which follows from FIG. 6B) depicts the SOI wafer embodiment. The particular etch chemistry used will of course depend on the particular gate material present. However, by way of example only, for a polysilicon gate stack, a polysilicon-selective RIE may be employed, and a wet etch may be employed to remove gate metals. Any mask 602/604 remaining after the etch can be removed using, e.g., CMP or grinding. Further, while FIGS. 7A and 7B show the selective removal of one gate from between two adjacent gate stacks, this is merely exemplary. Namely, multiple adjacent gate stacks can be removed in the same manner as described, e.g., in order to achieve a greater gate pitch in that region.

The result is a plurality of gate stacks 502/504 having an irregular pitch. Specifically, a first gate pitch is present in some regions while a second, larger gate pitch is present in other regions. Thus, the gate stacks formed in one or more regions of the wafer have a first gate pitch and the gate stacks formed in one or more other regions have a second gate pitch, where the second gate pitch is larger than the first gate pitch. Using a non-limiting example to illustrate this concept, for a given gate pitch x, a first gate pitch of 1x may be present in some regions of the wafer, while a second (larger) gate pitch of 2x, 3x, etc. is employed for other regions. Thus, for instance, if a gate pitch x of 200 nm is being employed, the first gate pitch will be 200 nm and the second gate pitch will be 400 nm. In this example, this irregular gate pitch is achieved by selectively eliminating one or more of the gate stacks 502/504. It is notable that by comparison with the embodiment provided above where patterning is used to form an irregular gate pattern, here employing a regular gate pattern and then selectively eliminating one or more gate stacks will result in a gate pitch that is a multiple of the starting gate pitch (e.g., 2x, 3x, etc., see above). However, as described above and below, the techniques provided herein may be combined to achieve any desired gate-to-gate spacing. Thus, by way of example only, a combination of the first (irregular gate stack patterning) embodiment with this second (selective gate elimination) embodiment and/or a combination of the gate trimming (so as to reduce gate stack length) embodiment with this (selective gate elimination) embodiment can be implemented to achieve any desired combination of larger/smaller gate pitch/gate-to-gate spacing. Thus, fractional gate pitch values can be achieved in this manner, e.g., 1.5x pitch.

The above-provided gate pitch values (e.g., 1.5x, 2x, 3x, etc.) are merely exemplary and, according to the present techniques, any gate pitch values may be employed as long as there is at least one region of the wafer having gate stacks with a first pitch and at least one other region of the wafer having gate stacks with a second pitch such that the second pitch is greater than the first pitch. As will be apparent from the description below, the pitch employed in the second (larger) gate pitch regions will depend on the angle of the tilted implant that is being employed in the asymmetric devices.

As is apparent from FIGS. 7A and 7B, selectively employing a larger gate pitch (by, in this case, selectively removing a gate or gates) in one or more regions increases the gate-to-gate spacing in these regions vis-à-vis the regions of the wafer having a smaller gate pitch. See also FIG. 9, described below. FIGS. 7A and 7B portray the non-limiting example described above wherein the gate stacks formed in one or more regions of the wafer have a (first) 1x gate pitch and the gate stacks formed in one or more other regions have a (second) 2x gate pitch. This is merely an example being provided to illustrate the present techniques. As highlighted above, any irregular gate pitch values may be employed (e.g., 1.5x, 2x, 3x, etc.) as long as there is at least one region of the wafer having gate stacks with a first pitch and at least one other region of the wafer having gate stacks with a second pitch such that the second pitch is greater than the first pitch.

Accordingly, the gate stacks in this embodiment are produced having an irregular gate-to-gate-spacing, with the gate-to-gate spacing in the (in this example the 1x gate pitch regions) being smaller than the gate-to-gate spacing in the (in this example the 2x gate pitch regions). As provided herein, the present techniques are used to increase/employ a larger gate-to-gate spacing on a source side of one or more of the active areas. This will permit the space necessary (free from adjacent gate shielding) to perform an angled halo or extension implant into the active area(s).

By way of example only, as shown in FIGS. 7A and 7B, for a given active area a, the pitch on a source side (in this case to the left) of the active area a is larger (in this example 2x), whereas the pitch on a drain side (in this case to the right) of the active area a is smaller (in this example 1x), wherein for example 2x>1x. Reference to FIG. 9 described below, for example, reveals that this configuration corresponds to a greater gate-to-gate spacing on the source side of the active area a as compared to the gate-to-gate spacing on the drain side of the active area a. Accordingly, the increased gate-to-gate spacing on the source side of the active area will permit the space needed to perform angled implants into the source side of the active area a(see below).

As described above, the dimensions of the gate stacks may be chosen and/or selectively tailored so as to increase the gate-to-gate spacing. Gate length, for example, can be selectively decreased for one or more of the gates, thereby increasing the gate-to-gate spacing (for a given gate pitch) for these reduced-length gates. See FIGS. 9 and 10, described below. Thus, by way of example only, the gate-to-gate spacing achieved by selectively eliminating one or more of the gate stacks can be further tailored (e.g., increased further) by selectively scaling the length of one or more of the gates (as illustrated, for example, in FIG. 10) so as to achieve an even larger gate-to-gate spacing. According to an exemplary embodiment, the gates are each patterned having a common gate length L and (following the above-described gate elimination process) an additional step is employed to selectively reduce the gate length of one or more of the gates. Following this gate length reducing step, one or more of the gate stacks will have a smaller gate length, i.e., $L_{reduced}$, as compared to the gate length L of the other (unaltered) gate stacks. By way of example only, in the context of the exemplary procedure shown illustrated in FIGS. 7A and 7B, the length of one or more of the gate stacks can be reduced to further increase gate-to-gate spacing. For instance, reducing the length of the gate stack (as indicated in FIGS. 7A and 7B) will further increase the gate-to-gate spacing beyond that achieved by patterning the gate stacks with a (e.g., 2x) pitch. This gate length scaling process can be performed on any of the gate stacks and is thus not limited to those indicated in FIGS. 7A and 7B. This gate length scaling process may or may not result in a change in gate pitch. Namely, as described above, gate pitch is defined herein as a distance from the middle of one gate stack to the middle of the next adjacent gate stack. Thus, if the gate length scaling process is performed uniformly to thin both sides of the gate stack (see FIGS. 9 and 10, described below), then the gate pitch may not change, but the gate-to-gate spacing will increase. According to an exemplary embodiment, the gate length of one or more of the gate stacks is reduced by patterning a hardmask (e.g., a nitride hardmask) that i) completely covers those gate stacks which will not be altered and ii) covers a central portion of the gate stack(s) the length of which will be reduced. See, for example, FIG. 10, described below. Of course, the amount of the hardmask covering the gate stack(s) to be altered (and how much of those gate stacks remain exposed) is dependent on how much thinning of the gate stack(s) is desired. The formation of a hardmask meeting these requirements is well within the capabilities of one skilled in the art. An etch (for example a RIE process) through the hardmask can then be used to remove gate stack material from the selectively masked gate stack(s) (again see, for example, FIG. 10, described below) to thin and thereby reduce the length of those etched gate stacks. Any hardmask remaining after the etch can be removed using an etching process such as CMP.

Figure 8A:
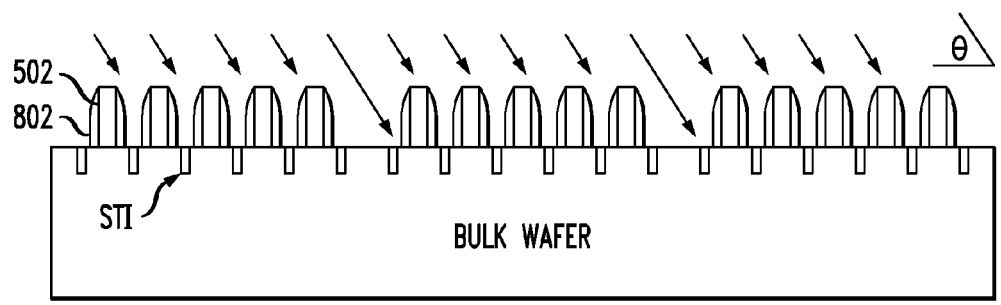
FIG. 8A is a cross-sectional diagram illustrating spacers having been formed on opposite sides of the gate stacks and an angled halo/extension implant being performed in the bulk wafer configuration according to an embodiment of the present invention.

Following formation and selective removal of one or more of the gate stacks 502/504, spacers 802/804 may be formed on opposite sides of the gate stacks 502/504. See FIGS. 8A and 8B, respectively. FIG. 8A (which follows from FIG. 7A) depicts the bulk wafer embodiment, whereas FIG. 8B (which follows from FIG. 7B) depicts the SOI wafer embodiment. According to an exemplary embodiment, spacers 802/804 are formed by first blanket depositing a nitride material (e.g., silicon nitride) onto the wafer (e.g., using CVD and then patterning the spacers 802/804 using a nitride-selective RIE.

Figure 8B:
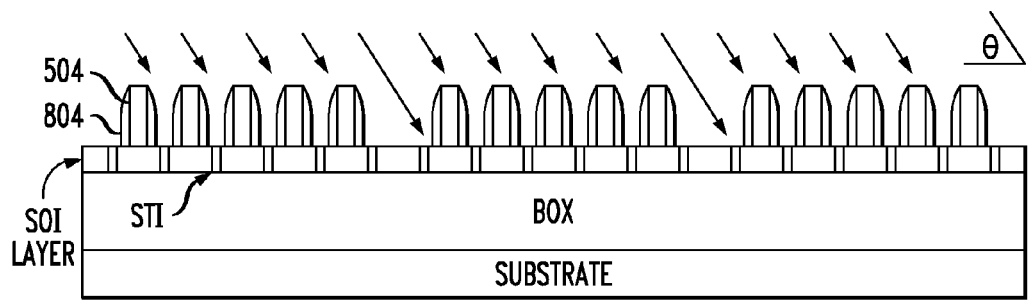
FIG. 8B is a cross-sectional diagram illustrating spacers having been formed on opposite sides of the gate stacks and an angled halo/extension implant being performed in the SOI wafer configuration according to an embodiment of the present invention.

As shown in FIGS. 8A and 8B, an angled halo or extension implant is then performed. As will be described in detail below, in the case of halo implants, the present techniques may be used to determine an optimum angle (or strength) of the angled halo implant as per device performance. The implant is preferably performed at an angle θ of from about 20 degrees to about 30 degrees into the source side of the active areas having an increased/that employ a larger gate-to-gate spacing. Implants at more or less aggressive angles may also be employed in the same manner. As highlighted above, the pitch employed in the second (larger) gate pitch regions of the wafer will depend on the angle of the tilted implant that is being employed in the asymmetric devices. Thus, a smaller, less aggressive angle of implant will require a greater pitch (e.g., a 20 degree implant will require more space and thus a greater pitch than would a 30 degree implant). Suitable implant dopants include, but are not limited to, p-type dopants (for an n-channel FET device) such as B, In, $BF_2$, etc., or n-type dopants for a p-channel (FET) device) such as P, As, Sb, etc. A detailed view of the angled halo/extension implant in a bulk/SOI wafer is shown in FIGS. 4A and 4B, described above. The devices receiving an angled halo or extension implant are referred to herein as asymmetrical devices, while those devices not receiving an angled halo or extension implant are referred to herein as symmetrical devices.

For those devices not receiving an angled halo or extension implant (i.e., the symmetrical devices), a step may be employed (not shown) to perform a conventional vertical implant. According to an exemplary embodiment, this vertical implant step is performed either immediately before, or immediately after the angled halo or extension implant is performed. As above, suitable implant dopants include, but are not limited to, p-type dopants (for an n-channel FET device) such as B, In, $BF_2$, etc., or n-type dopants for a p-channel FET device) such as P, As, Sb, etc. Any further standard processing steps may also be performed, if so desired, to complete the device. By way of example only, raised source and drain regions may be formed using conventional epitaxy processes, and may be doped accordingly.

FIG. 9 shows how gate pitch and gate-to-gate spacing are measured. As highlighted above, gate pitch is measured as a distance from the middle of one gate to the middle of the next, adjacent gate. This measurement is shown in FIG. 9 as gate pitch x. The above-described techniques were directed to (selectively) increasing the gate pitch (e.g., from 1x to 2x) for certain regions so as to increase the gate-to-gate spacing. It is apparent from FIG. 9 how increasing the gate pitch would serve to increase the gate-to-gate spacing.

FIG. 9 also illustrates the gate length measurement, which introduces a third exemplary embodiment for achieving increased gate-to-gate spacing. This technique involves, for a given gate pitch, decreasing the gate length to achieve increased gate-to-gate spacing. Compare, for example, FIG. 9 with FIG. 10.

Figure 10:
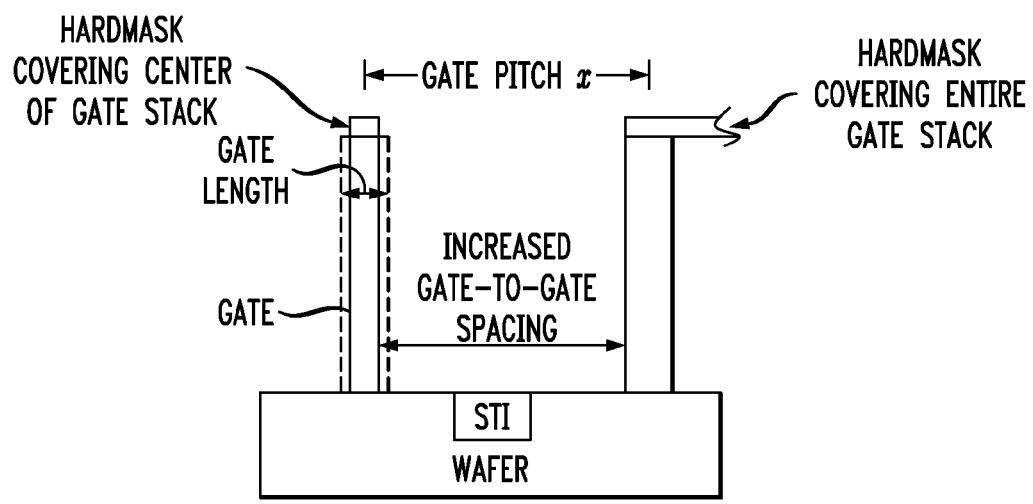
FIG. 10 is a cross-sectional diagram illustrating how increasing the gate length can increase the gate-to-gate spacing according to an embodiment of the present invention.

In FIG. 10, the gate length of one of the gate stacks shown (in this example the gate stack on the left) has been decreased. As a result, the gate-to-gate spacing has been increased. The gate pitch, however, has not changed since gate pitch is measured from the middle or center of the gate. As further shown in FIG. 10, the hardmask used to cover the thinned gate stack(s) covers only a central portion of the respective gate stack(s) (the size of the mask depending on how much the gate stack(s) is to be thinned), while the hardmask over the gate stack(s) which will not be altered completely covers these gate stacks so as to protect them during the subsequent etch. As FIG. 10 indicates, the hardmask covering the unaltered gate stacks can be blanket deposited so as to cover multiple gate stacks, if so desired.

The details of masking and selectively thinning one or more of the gate stacks so as to reduce the length of the thinned gate stack(s) was described in detail above. This step of decreasing the gate length (so as to increase the gate-to-gate spacing) may be performed in conjunction with either, or both, of the embodiments (e.g., irregular gate stack patterning/removing a gate stack) described above in order to further increase the gate-to-gate spacing. However, decreasing the gate length may be implemented in accordance with any other device fabrication process in order to achieve a greater gate-to-gate spacing, and thus is not limited to the processes described above.

The FET devices fabricated according to the present techniques may be employed in conventional logic circuits, such as NAND gates, AND, OR and NOR gates. In addition, the present FET devices may be used as test structures for evaluating the impact of halo shadowing in planar devices in that the device may be measured twice (once in one source/drain configuration and a second time with source and drain nodes swapped). By examining the asymmetry in the short channel behavior in both measurements, the relative strengths of the asymmetric halos can be determined. By way of example only, any of the above-described techniques can be used to change the gate-to-gate spacing of one or more of the FET devices. The greater the gate-to-gate spacing, the less the shadowing effect (from the adjacent device) and thus the more asymmetric (greater angle of tilted implant) can be employed. Halo strength is an indicator of how asymmetric or at how much of an angle the tilted implant is performed. Thus, any one of the above-described fabrication techniques, alone or in combination (see above), can be used to produce a variety of devices with varying gate-to-gate spacing. Going from a smaller gate-to-gate pitch to a larger gate-to-gate pitch, an increasingly greater angle of implant can be used (larger asymmetry).

It is notable that device performance (measured for example using a ring oscillator as explained below), may be increased by using a stronger, more asymmetric implant (based on a greater gate-to-gate spacing). There are however tradeoffs. Namely, the ring oscillator speed is related to capacitance (C), voltage (V) and current (I) as follows:

$$CV/I.$$

By using a more asymmetric implant, the capacitance increases, but so does the resistance (and resistance affects current (I)). Thus, there is likely an optimal halo strength (amount of implant asymmetry, i.e., resulting from a certain amount of gate-to-gate spacing as produced by the present techniques) that has a favorable amount of capacitance as well an acceptable amount of resistance. This optimal point can be determined using the present techniques.

Namely, FET devices can be produced using the above-described processes having various different gate-to-gate spacings which permit different strength asymmetric implants (for example, ranging from a symmetrical/vertical implant to an aggressive 30 degree angle tilted implant, and values in between) to be performed. The resulting devices can then be tested using a ring oscillator circuit. As is known in the art, a ring oscillator contains a plurality of inverters connected in a loop. Ring oscillators are commonly employed as test circuits. The speed of the ring oscillator circuit will determine the performance of the devices, and from that data, the optimal device configuration (based in this case on gate-to-gate spacing and resultant angle of implant) can be determined. It is assumed that oscillator speed will increase with increased implant angle to a certain point, beyond which, increasing the angle of implant will decrease the oscillator speed due to increased resistance.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A FET device, comprising:
a wafer;
active areas formed in the wafer;
gate stacks on the wafer present over one or more of the active areas, wherein the gate stacks have an irregular gate-to-gate spacing in that the gate-to-gate spacing between a given two of the gate stacks next to one another on the wafer is selectively configured to be greater than the gate-to-gate spacing of the gate stacks on the wafer to either side of the given two gate stacks, wherein by way of the irregular gate-to-gate spacing: i) for at least a given one of the active areas in which an asymmetrical transistor is present a gate-to-gate spacing on a source side of the given active area is greater than a gate-to-gate spacing on a drain side of the given active area, and ii) for at least another given one of the active areas in which a symmetrical transistor is present a gate-to-gate spacing on a source side of the other given active area is equal to a gate-to-gate spacing on a drain side of the other given active area;
spacers on opposite sides of the gate stacks; and
an angled implant in the source side of the given active area,
wherein the gate-to-gate spacing employed on the source side of the given active area is dependent on an angle of the angled implant in the source side of the given active area in that the gate-to-gate spacing on the source side of the given active area is chosen such that none of the gate stacks on the wafer shield the angled implant in the source side of the given active area, and wherein the gate stacks on the wafer all have a same height, and wherein a greater gate-to-gate spacing on the source side of the given active area is employed to permit a greater asymmetry of the angled implant in the source side of the given active area.

2. The FET device of claim 1, wherein the wafer comprises a bulk silicon, germanium, or silicon-germanium wafer.

3. The FET device of claim 1, wherein the wafer comprises a semiconductor-on-insulator (SOI) wafer having a SOI layer separated from a substrate by a buried oxide (BOX).

4. The FET device of claim 3, wherein the SOI layer comprises silicon, germanium, or silicon germanium.

5. The FET device of claim 1, wherein the spacers comprise a nitride material.

6. The FET device of claim 5, wherein the nitride material is silicon nitride.

7. The FET device of claim 1, wherein the angled implant comprises an angled halo implant or an angled extension implant.

8. The FET device of claim 1, wherein the gate stacks have an irregular gate pitch.

9. The FET device of claim 8, wherein the irregular gate pitch comprises at least a first 1x gate pitch and at least a second 2x gate pitch such that the second gate pitch is 2x greater than the first gate pitch.

10. The FET device of claim 1, wherein at least one of the gate stacks has a decreased gate length that is less than a gate length of one or more other of the gate stacks, and wherein the at least one gate stack that has the decreased gate length is adjacent to the source side of the given active area.

11. The FET device of claim 1, wherein the gate stacks comprise at least one metal.

12. The FET device of claim 1, wherein the gate stacks comprise polysilicon.

13. The FET device of claim 1, wherein the gate stacks comprise a dielectric material.

14. The FET device of claim 1, wherein the angled implant comprises a p-type dopant.

15. The FET device of claim 14, wherein the p-type dopant comprises boron, indium or boron fluoride.

16. The FET device of claim 1, wherein the angled implant comprises an n-type dopant.

17. The FET device of claim 16, wherein the n-type dopant comprises phosphorous, arsenic or antimony.

18. The FET device of claim 9, wherein one or more of the first gate pitch and the second gate pitch comprises a fractional gate pitch.

19. The FET of claim 10, wherein a pitch of the gate stacks is unaffected by the decreased gate length.

20. The method of claim 1, wherein the gate stacks have an irregular gate pitch in which all but a select two of the gate stacks on the wafer have a 1x gate pitch, and wherein the select two gate stacks have a 2x gate pitch.

* * * * *